United States Patent [19]

Hassan et al.

[11] Patent Number: 4,607,277
[45] Date of Patent: Aug. 19, 1986

[54] SEMICONDUCTOR ASSEMBLY EMPLOYING NONEUTECTIC ALLOY FOR HEAT DISSIPATION

[75] Inventors: Javanthu K. Hassan, Hopewell Junction; Sevgin Oktay, Poughkeepsie; John A. Paivanas, Hyde Park; Clarence J. Spector, Hopewell Junction, all of N.Y.

[73] Assignee: International Business Machines Corporation, Armonk, N.Y.

[21] Appl. No.: 637,653

[22] Filed: Sep. 20, 1984

Related U.S. Application Data

[63] Continuation of Ser. No. 364,722, Mar. 16, 1982, Continuation of Ser. No. 364,722, Mar. 15, 1982.

[51] Int. Cl.⁴ .............. H01L 23/26; H01L 21/447; H01L 23/10
[52] U.S. Cl. ........................................ 357/81; 357/79
[58] Field of Search ........................... 357/81, 79, 72; 174/16 HS; 165/79, 80 C, 80 B, 83

[56] References Cited

U.S. PATENT DOCUMENTS 3,271,638  9/1966  Murad ................................. 357/72
4,193,445  3/1980  Chu et al. ........................... 357/79
4,462,463  7/1984  Meagher et al. .................... 357/81

FOREIGN PATENT DOCUMENTS 52-28270  3/1977  Japan ................................. 357/67

Primary Examiner—Andrew J. James
Assistant Examiner—S. V. Clark
Attorney, Agent, or Firm—Wolmar J. Stoffel

[57] ABSTRACT

A cooling means for a circuit chip device employs a noneutectic metal alloy to form a low thermal resistance bridging interface between the surface of the chip device and a heat sink. The alloy has a solidus-liquidus temperature range such that the solidus is slightly below the maximum operating temperature of the chip, and thus has the capability to reestablish and maintain the interface at a low thermal resistance if stressed during circuit operation, even with a low current load at the interface of the chip device and the heat sink. In addition to the chip interface, the above cooling means is also used at other interfacial regions of the heat sink, dependent on design, to achieve very low thermal resistance.

12 Claims, 5 Drawing Figures

SEMICONDUCTOR ASSEMBLY EMPLOYING NONEUTECTIC ALLOY FOR HEAT DISSIPATION

This application is a continuation of Ser. No. 364,722 filed 3/16/82.

DESCRIPTION

1. Technical Field

This invention relates to heat dissipation means for a semiconductor comprising an integrated circuit chip device, and in particular to a method and means for sustaining low thermal contact resistance to achieve chip cooling.

2. Background Art

In semiconducor technology, as applied to integrated circuit (IC) chip devices, it is highly desirable to avoid the imposition of heavy loads on the chip surface, while maintaining intimate contact at the interface between the chip and an adjacent component, such as a heat sink. The intimate contact serves to enhance power dissipation so as to prevent excessive temperature rise and to minimize possible adverse effects, such as dimensional variations, differential thermal expansion, and the like.

For proper power dissipation, it is necessary to draw heat away from the semiconductor chip, and to dissipate the heat in an efficient manner. The heat is generally transferred from one surface of the chip to a heat diffuser or a heat sink, or to a cooling device, for example; and from the opposite surface of the chip to a substrate through a bonding material. The resistance to heat flow through the latter path is relatively much higher. Consequently, the thermal resistance at the interface between the chip surface and the heat diffuser should be minimal in order to maximize heat dissipation.

Generally, prior art heat dissipation techniques of IC semiconductor chip devices can provide thermal control up to a maximum allowable chip temperature of 85° C. without serious problems. However, with the tendency to make semiconductor chips with higher circuit densities, much smaller, and to operate with more power, the magnitude of the heat increases drastically so that presently used cooling techniques alone do not solve the problem of excessive heat. Therefore, it is critical that the thermal resistance at the chip interface be substantially lowered. Furthermore, it is also very important to minimize the thermal resistance at other interfacial locations of the heat sink structure.

However, the mechanical configurations of prior art IC semiconductor chip assemblies affect the value of the thermal contact resistance that may be attained. For example, what appears to be a smooth continuous bonding of the chip surface and the heat transfer device is in effect a series of relatively few contact points with interposed voids for the most part. Thus, the contact interface provides a relatively high thermal resistance. Ideally, it would be desirable for very small IC semiconductor chip devices to have a very low contact load at the interface and yet realize a low thermal resistance. Furthermore, these conditions must be controlled and maintained at proper levels for the life of the product.

DISCLOSURE OF INVENTION

The technical problems solved by this invention are the efficient dissipation of heat and temperature control in an integrated circuit semiconductor chip device. A non-eutectic metal alloy is used to form a low thermal resistance bridging interface between the surface of the chip device and a heat sink. The alloy has a solidus-liquidus temperature range such that the solidus is slightly below the maximum operating temperature of the chip, and thus has the capability to reestablish and maintain the interface at a low thermal resistance if stressed during circuit operation, even with a low contact load at the interface of the chip device and the heat sink. In addition to the chip interface, the heat dissipation means is also used at other interfacial regions of the heat sink, dependent on design, to achieve very low thermal resistance.

BEST MODE FOR CARRYING OUT THE INVENTION

Figure 1A:
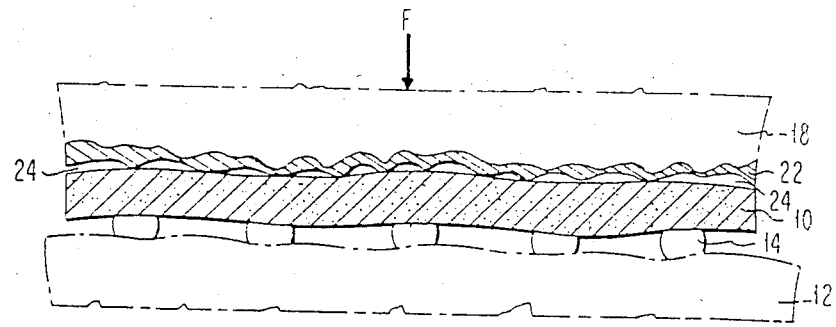
FIGS. 1A and 1B are sectional views of an IC circuit semiconductor chip assembly, depicting the condition of the interface between the chip surface and the surface of a heat sink under a contact load, when the chip temperature is respectively less than and greater than the solidus temperature.

With reference to the drawings, an IC semiconductor comprises a semiconductor chip 10 that is bonded to a substrate 12 by bonding means 14, which may be solder ball connections, by way of example. A controlled load force F is applied, as designated by the arrow, by means of a spring 16, for example, to the chip 10 to maximize the surface contact of the chip with a pivotable piston heat transfer element 18 of a high thermal conductivity material such as copper. Heat generated in the chip is conducted across the chip interface into the piston element and from the element to the surrounding structure essentially by gaseous conduction across the gap spaces 26. The surrounding hat structure 20 provides a cover and additional heat diffusing means for the IC package.

In accordance with this invention, during assembly of the IC package, a low temperature noneutectic bismuth alloy 22 is bonded to the heat transfer element. In a preferred implementation, the alloy used is commercially available Ostalloy, a product of Arconium Corp. of America. The alloy is composed of 51.45% bismuth, 31.35% lead, 15.20% tin and 2.0% indium, and is characterized by a solidus temperature $T_S$ of about 88° C., and a liquidus temperature $T_L$ of about 112° C. An alternative low melting temperature alloy that may be used has a composition of 48.35% bismuth, 28.15% lead, 14.50% tin and 9.0% antimony, and has a solidus temperature of about 87° C. and liquidus temperature of about 128° C. Still other compositions are also practical depending on desired thermal operating conditions of the IC device.

The bismuth alloy 22 is deposited on the heat sink surface to a thickness of approximately 2 mils, and as illustrated in FIG. 1A, initially only makes actual contact with the surface of the chip 10 at spaced points between voids 24. With this initial condition of the alloy randomly contacting the cold chip surface over a small aggregate heat transfer area, the interface termal resistance is relatively high, and heat transfer is relatively low.

Figure 1B:
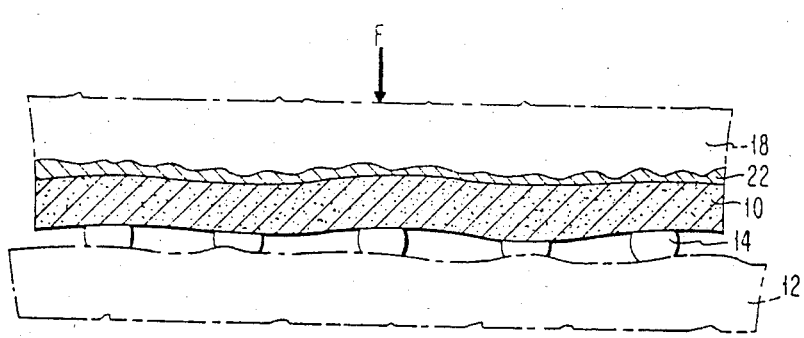

During the IC package assembly, and after the bismuth alloy has been deposited, the temperature of the device is raised to the melting range of the alloy. As the temperature of the chip is increased to a temperature $T_C$ greater than the solidus temperature $T_S$, the bismuth alloy melts and conforms under viscous flow conditions by the action of the applied force F, to fill the void spaces 24, as depicted in FIG. 1B. The resulting increased contact area and thus the thermal enhanced path between the chip and the heat transfer element through the alloy now filling the voids causes a sharp decrease in thermal resistance at the interface and thus allows effective dissipation of the excessive heat. In this basic process, the above local conforming action of the thin alloy layer is confined to the interface region by the controlling action of surface tension forces.

During continued operation in the field, if disruptions due to dimensional variations, differential thermal expansions and impact load effects, by way of example, occur at the contact interface between the surface of the chip and the heat transfer element, the thermal contact resistance will increase momentarily due to the reoccurrence of voids. As a result, there will be a brief temperature rise excursion into the melting range of the alloy, thereby recovering the low thermal resistance, which is followed by a rapid decrease of temperature to its initial, unperturbed state. In effect, a self-healing process of the alloy melting to conform to the chip surface occurs so that the contact thermal resistance is reduced and further maintained at a low level.

In a preferred implementation, chip interface thermal resistance of 0.1° to 0.2° C. per watt are obtained with contact loads of approximately 100 grams. As a comparison, the resistance levels obtained by means of this invention are approximately five to seven times lower than that realized with thermal grease.

Figure 3:
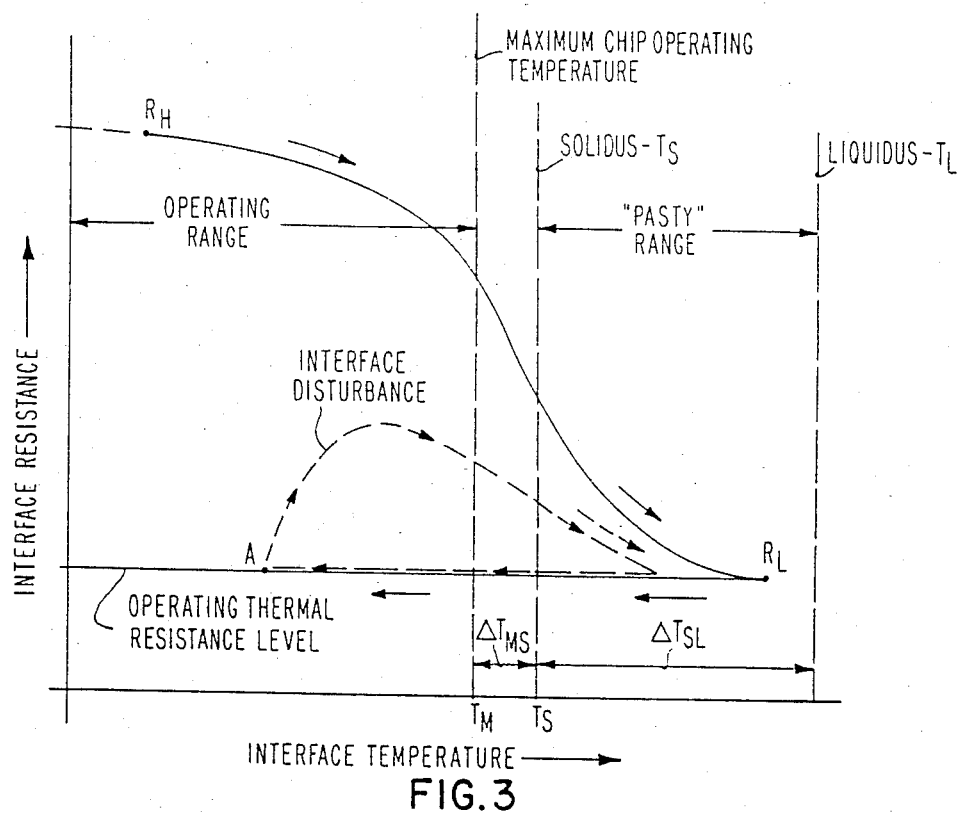
FIG. 3 is a plot of interface resistance relative to interface temperature, illustrating the thermal resistance reduction and maintenance characteristics at the chip interface with a constant interface contact load.

The process according to this invention is illustrated in FIG. 3. The relatively high resistance $R_H$, at the time of assembly, is reduced to a low level $R_L$ by a reflow operation. Upon reducing the temperature below the maximum operating condition, the resistance remains at such low level $R_L$ in the operating temperature range. However, if an interface disturbance occurs, as illustrated at point A, the rise in resistance causes a temperature rise into the pasty range where the resistance and temperature both decrease rapidly back to their initial states. By way of example, the maximum solidus temperature $\Delta T_{MS}$ would be in the order of 1°-3° C., while the solidus-liquidus $\Delta T_{SL}$ may be in the range of 15°-25° C.

With this invention, the system is always in a solid state under normal operating conditions. Any excursions into the solidus-liquidus range for thermal resistance-temperature recovery constitutes a very small time period relative to the product life. Since the system is virtually always in the solid state, contact loads at the interface are low and adverse metallurgical phenomena are essentially eliminated. Also, once the initial low resistance value $R_L$ is obtained, any disturbances at the chip surface will cause momentary increases in resistance. These small resistance changes are removed in very short time periods. By means of the self-healing technique disclosed, an extremely low thermal resistance level is maintained without the need for extra reflow steps. The disclosed technique ensures long-term maintenance of low thermal resistance at the chip interface, which is very significant as chip sizes decrease and power dissipation requirements rise.

Figure 2:
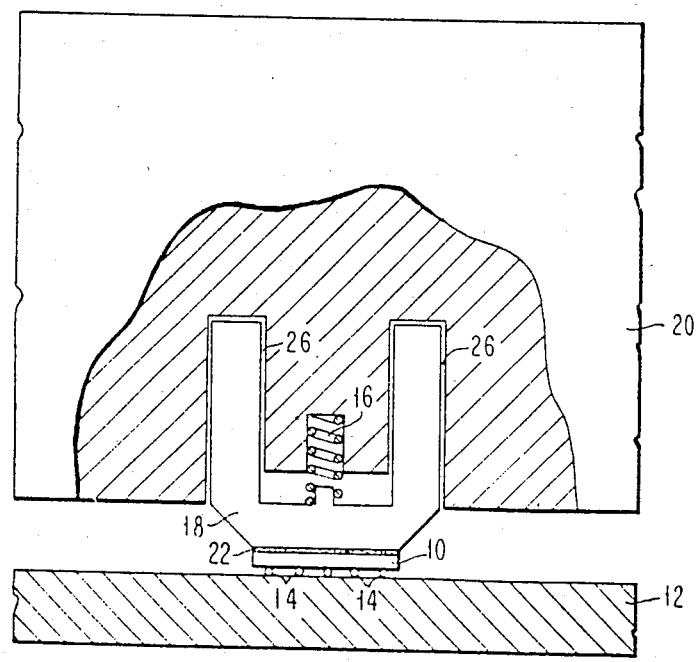
FIG. 2 is a sectional view, partially cut away, of one illustrative heat sink technique in an IC chip assembly incorporating the invention at the chip interface.
Figure 4:
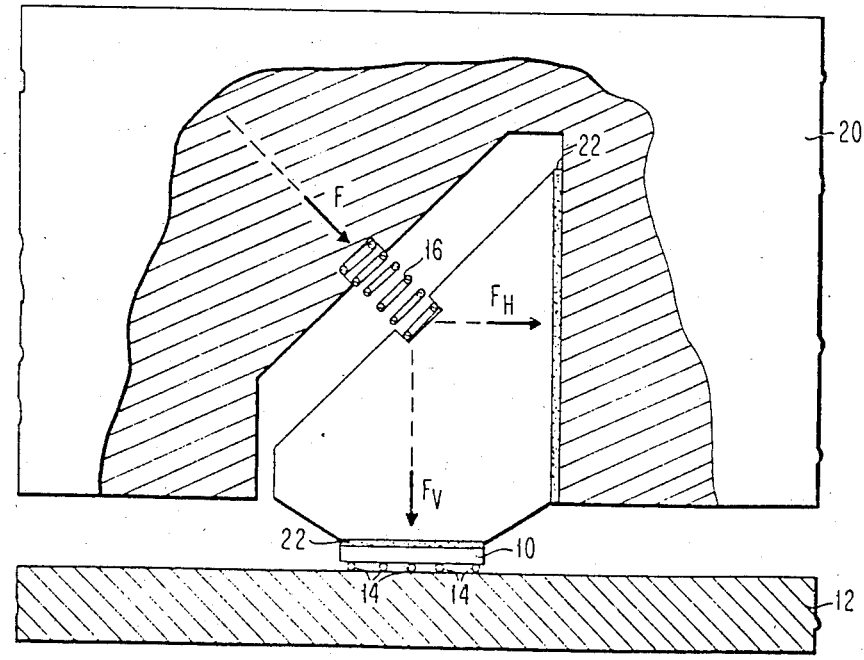
FIG. 4 is a sectional view, partially cut away, of another heat sink technique in an IC chip assembly incorporating the invention at both the chip and hat cover interfaces.

In addition to achieving low thermal resistance at the chip interface, as by application of the illustrated heat sink technique in FIG. 2, this invention can also be applied to other interfaces in a heat sink structure to obtain low thermal resistance. An example of such a structure, where this invention is used at both the chip and hat interfaces, is illustrated in FIG. 4. A controlled load force F is applied diagonally, as designated by the arrow, by means of a spring 16, for example, to a pivotable piston heat transfer element 18. By this arrangement, the surface contacts of the heat transfer element 18 with the chip surface 10 and hat surface 20 are maximized and acted on by load force components $F_V$ and $F_H$, respectively. The bismuth alloy 22 is desposited on each surface of the piston to a thickness of approximately 2 mils, and as illustrated in FIG. 1A, initially only makes actual contact with the surface of the chip 10 at spaced points between the voids 24. Similarly, the contact of the alloy 22 with the hat 20 surface also involves point contacts and void spaces. With this initial condition of the alloy randomly contacting the cold chip and hat surfaces over a small aggregate heat transfer area, the thermal resistance at the interfaces is relatively high, and heat transfer is relatively low.

During the IC package assembly, and after the bismuth alloy has been deposited, the temperature of the device is raised to the melting range of the alloy. As the temperature of the chip is increased to a temperature $T_C$ greater than the solidus temperature $T_S$, the bismuth alloy melts and under the action of the applied force component $F_V$, fills the void spaces as described previously. Essentially at the same time, due to the high thermal conductivity of the intervening piston material, the alloy melts at the hat interface, and under the action of the applied force component $F_H$, fills the void spaces in this region. The resulting increased contact area at both interfaces causes a sharp decrease in thermal resistances and thus allows effective dissipation of the excessive heat.

During continued operation in the field, if disruptions to the interfaces occur, for reasons as discussed previously in connection with the chip contact, the thermal contact resistances will increase momentarily due to the reoccurrence of voids at the chip and hat interfaces. As a result, there will be brief temperature rise excursions into the melting range of the alloy, thereby recovering the low thermal resistances followed by a rapid decrease of temperatures to initial, unperturbed states. In effect, a self-healing process of the alloy melting to conform to the chip and hat surfaces occurs so that the contact thermal resistances are reduced and further maintained at low levels.

The process according to this invention is illustrated in FIG. 3 for the case of the chip contact surface condition. The process of the hat interface condition is the same as that for the chip contact. Thus, in both interface conditions the relatively high resistances $R_H$, at the time of assembly, are reduced to low levels $R_L$ by a reflow operation. Upon reducing the temperature below the maximum operating condition, the resistances remain at such low levels $R_L$ in the operating temperature range. If disturbance of the interfaces occurs, the self-healing action of the alloy causes a rapid recovery of the low thermal resistances and temperatures in a manner discussed previously in connection with FIG. 3.

As discussed above, in a preferred implementation the chip interface thermal resistance of 0.1° to 0.2° C. per watt are obtained with contact loads of approximately 100 grams. For the relatively much larger contact area of the bismuth alloy with the hat surface and with this magnitude of contact loads, the corresponding preferred hat interface thermal resistances are in the range of 0.01° to 0.02° C. per watt.

The IC chip cooling techniques illustrated in FIGS. 2 and 4 represent just two of a number of possible configurations for achieving and maintaining highly effective heat dissipation. With the structure of this invention, applications that require from 9–20 watts/chip heat dissipation are feasible.

We claim:

1. A semiconductor assembly comprising, a substrate, a semiconductor chip having first and second surfaces, said chip having solder terminals on said first surface bonded to said substrate, a heat transfer element disposed closely adjacent to said second surface of said chip, a means to urge said transfer element into contact with said second surface, and a thin layer of heat conductive, non-eutectic metal alloy having a solidus temperature that is only slightly above the operating temperature range of said chip disposed between said heat transfer element and said chip, said material providing a highly thermally conductive heat transfer path between said chip and said heat transfer element, and having the ability to re-establish a low thermal resistance heat conductive path in the event that intimate contact between said material and said chip and/or said heat transfer element is disrupted by the reforming of the material when increased thermal resistance causes the chip temperature to exceed the solidus temperature of the material, and having the ability to remain in position between said chip and said heat transfer element.

2. A semiconductor assembly as in claim 1, wherein said heat transfer element is a spring type piston for providing a load force to said layer of conductive, non-eutectic metal alloy to increase the contact between said piston and said chip.

3. A semiconductor assembly as in claim 1, including solder ball connections for bonding said chip to said substrate.

4. A semiconductor assembly as in claim 2, including a hat for providing a cover for said assembly and for diffusing heat.

5. A semiconductor assembly as in claim 4, including a diagonal spring type piston for providing a load force to said heat transfer element to increase the contact between said element and said transfer chip and said hat.

6. A semiconductor assembly as in claim 5, wherein the piston is of a high thermal conductivity material.

7. A semiconductor assembly as in claim 4, wherein the thermal resistance between said hat and said heat transfer element is in the range of 0.01°–0.02° C. per watt for a contact load of 100 grams.

8. A semiconductor assembly as in claim 1, wherein the thermal resistance between said chip and said heat transfer element is in the range of 0.1°–0.2° C. per watt for a contact load of 100 grams.

9. A semiconductor assembly as in claim 1, wherein said noneutectic alloy is formed with bismuth.

10. A semiconductor assembly as in claim 1, wherein said alloy is made of 51.45% bismuth; 31.35% lead; 15.20% tin and 2.0% indium by weight.

11. A semiconductor assembly as in claim 1, wherein said alloy is made of 48.35% bismuth; 28.15% lead; 14.50% tin and 9.0% antimony by weight.

12. A semiconductor assembly as in claim 1, wherein the thickness of said alloy layer is about 2 mils.

* * * * *